United States Patent
Cheng et al.

(10) Patent No.: US 11,682,715 B2
(45) Date of Patent: Jun. 20, 2023

(54) FORMING NANOSHEET TRANSISTOR USING SACRIFICIAL SPACER AND INNER SPACERS

(71) Applicant: Tessera LLC, San Jose, CA (US)

(72) Inventors: Kangguo Cheng, Schenectady, NY (US); Julien Frougier, Albany, NY (US); Nicolas Loubet, Guilderland, NY (US)

(73) Assignee: Tessera LLC, San Jose, CA (US)

( * ) Notice: Subject to any disclaimer, the term of this patent is extended or adjusted under 35 U.S.C. 154(b) by 99 days.

(21) Appl. No.: 17/465,135

(22) Filed: Sep. 2, 2021

(65) Prior Publication Data

US 2021/0399114 A1 Dec. 23, 2021

Related U.S. Application Data

(60) Continuation of application No. 16/391,622, filed on Apr. 23, 2019, now Pat. No. 11,121,233, which is a
(Continued)

(51) Int. Cl.
| | |
|---|---|
| *H01L 29/66* | (2006.01) |
| *H01L 29/786* | (2006.01) |
| *H01L 29/423* | (2006.01) |
| *H01L 21/311* | (2006.01) |
| *H01L 29/775* | (2006.01) |

(Continued)

(52) U.S. Cl.
CPC .... *H01L 29/6656* (2013.01); *H01L 21/31111* (2013.01); *H01L 21/31116* (2013.01); *H01L 29/42392* (2013.01); *H01L 29/6653* (2013.01); *H01L 29/66545* (2013.01); *H01L 29/66553* (2013.01); *H01L 29/66742* (2013.01); *H01L 29/775* (2013.01); *H01L 29/78696* (2013.01);
(Continued)

(58) Field of Classification Search
CPC .......... H01L 29/42392; H01L 29/0673; H01L 29/0665; H01L 29/0669; H01L 29/06656
See application file for complete search history.

(56) References Cited

U.S. PATENT DOCUMENTS

| | | |
|---|---|---|
| 2017/0110554 A1 | 4/2017 | Tak et al. |
| 2017/0250261 A1 | 8/2017 | Kim et al. |
| 2018/0175166 A1 | 6/2018 | Reboh et al. |

OTHER PUBLICATIONS

Office Action for U.S. Appl. No. 16/391,622, dated Jan. 28, 2021, Cheng, "Forming Nanosheet Transistor Using Sacrificial Spacer and Inner Spacers", 18 Pages.
(Continued)

*Primary Examiner* — John A Bodnar
(74) *Attorney, Agent, or Firm* — Haley Guiliano LLP

(57) ABSTRACT

Fabricating a nanosheet transistor includes receiving a substrate structure having a set of nanosheet layers stacked upon a substrate, the set of nanosheet layers including at least one silicon (Si) layer, at least one silicon-germanium (SiGe) layer, a fin formed in the nanosheet layers, a gate region formed within the fin, and a trench region adjacent to the fin. A top sacrificial spacer is formed upon the fin and the trench region and etched to form a trench in the trench region. An indentation is formed within the SiGe layer in the trench region, and a sacrificial inner spacer is formed within the indentation. A source/drain (S/D) region is formed within the trench. The sacrificial top spacer and sacrificial inner spacer are etched to form an inner spacer cavity between the S/D region and the SiGe layer. An inner spacer is formed within the inner spacer cavity.

20 Claims, 16 Drawing Sheets

Related U.S. Application Data division of application No. 15/880,757, filed on Jan. 26, 2018, now Pat. No. 10,424,651.

(51) Int. Cl.
  *H01L 29/78*  (2006.01)
  *H01L 29/165*  (2006.01)
(52) U.S. Cl.
  CPC ........ *H01L 29/165* (2013.01); *H01L 29/7848* (2013.01)

(56) References Cited

OTHER PUBLICATIONS

Non Final Office Action dated Jul. 2, 2020 for U.S. Appl. No. 16/391,622, "Forming Nanosheet Transistor Using Sacrificial Spacer and Inner Spacers", Cheng, 9 pages.

FORMING NANOSHEET TRANSISTOR USING SACRIFICIAL SPACER AND INNER SPACERS

CROSS-REFERENCE TO RELATED APPLICATION

This patent application is a continuation of and claims priority to U.S. patent application Ser. No. 16/391,622, filed Apr. 23, 2019, which is a division of U.S. patent application Ser. No. 15/880,757, filed Jan. 26, 2018, now U.S. Pat. No. 10,424,651, issued Sep. 24, 2019, which are fully incorporated herein by reference.

TECHNICAL FIELD

The present invention relates generally to a method for fabricating nanosheet transistors and a structure formed by the method. More particularly, the present invention relates to a method for fabricating nanosheet transistors using a sacrificial spacer and inner spacers and a structure formed by the method.

BACKGROUND

An integrated circuit (IC) is an electronic circuit formed using a semiconductor material, such as Silicon, as a substrate and by adding impurities to form solid-state electronic devices, such as transistors, diodes, capacitors, and resistors. Commonly known as a "chip" or a "package", an integrated circuit is generally encased in hard plastic, forming a "package". The components in modern day electronics generally appear to be rectangular black plastic packages with connector pins protruding from the plastic encasement. Often, many such packages are electrically coupled so that the chips therein form an electronic circuit to perform certain functions.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

A layout includes shapes that the designer selects and positions to achieve a design objective. The objective is to have the shape—the target shape—appear on the wafer as designed. However, the shapes may not appear exactly as designed when manufactured on the wafer through photolithography. For example, a rectangular shape with sharp corners may appear as a rectangular shape with rounded corners on the wafer.

Once a design layout, also referred to simply as a layout, has been finalized for an IC, the design is converted into a set of masks or reticles. A set of masks or reticles is one or more masks or reticles. During manufacture, a semiconductor wafer is exposed to light or radiation through a mask to form microscopic components of the IC. This process is known as photolithography.

A manufacturing mask is a mask usable for successfully manufacturing or printing the contents of the mask onto wafer. During the photolithographic printing process, radiation is focused through the mask and at certain desired intensity of the radiation. This intensity of the radiation is commonly referred to as "dose". The focus and the dosing of the radiation has to be precisely controlled to achieve the desired shape and electrical characteristics on the wafer.

The software tools used for designing ICs produce, manipulate, or otherwise work with the circuit layout and circuit components on very small scales. Some of the components that such a tool may manipulate may only measure tens of nanometer across when formed in Silicon. The designs produced and manipulated using these software tools are complex, often including hundreds of thousands of such components interconnected to form an intended electronic circuitry.

Many semiconductor devices are planar, i.e., where the semiconductor structures are fabricated on one plane. A non-planar device is a three-dimensional (3D) device where some of the structures are formed above or below a given plane of fabrication.

A Field Effect Transistor (FET) is a semiconductor device that has controls the electrical conductivity between a source of electric current (source) and a destination of the electrical current (drain). The FET uses a semiconductor structure called a "gate" to create an electric field, which controls the shape and consequently the electrical conductivity of a channel between the source and the drain. The channel is a charge carrier pathway constructed using a semiconductor material.

Nanosheet transistor devices are becoming increasingly pursed as a viable semiconductor device option, especially for transistors at smaller scales, e.g., at five nanometer (nm) and smaller scales. A nanosheet FET transistor typically includes a substrate, an isolation layer, a number of vertically stacked nanosheets forming a channel, and a gate. A nanosheet is formed of a thin layer of semiconductor channel material having a vertical thickness that is less than a width of the material.

SUMMARY

The illustrative embodiments provide a method and apparatus. An embodiment of a method of fabricating a nanosheet transistor includes receiving a substrate structure having a set of nanosheet layers stacked upon a substrate, the set of nanosheet layers including at least one silicon (Si) layer and at least one silicon-germanium (SiGe) layer, wherein the substrate structure further includes a fin formed in the stacked set of nanosheet layers, a gate region formed within the fin, and a trench region adjacent to the fin. The embodiment further includes forming a top sacrificial spacer upon the fin and the trench region, and etching the top sacrificial spacer to form a trench in the trench region and remove portions of the top sacrificial layer, the top sacrificial layer remaining on at least one side of the fin. The embodiment further includes forming an indentation within the at least one SiGe layer in the trench region, forming a sacrificial inner spacer within the indentation, and etching the sacrificial inner spacer to substantially remove portions of the sacrificial inner spacer deposited on the at least one Si layer. The embodiment further includes forming a source/drain (S/D) region within the trench, and etching the sacrificial top spacer and sacrificial inner spacer to form an inner spacer cavity between the S/D region and the at least one SiGe layer. The embodiment further includes forming a final top spacer on the fin, and forming an inner spacer within the inner spacer cavity.

An embodiment further includes etching the final top spacer to substantially remove the final top spacer from the S/D region. An embodiment further includes depositing a gate material within the gate region, forming a cap upon the gate material, and forming a contact upon the S/D region. In an embodiment, the gate material is a high-K metallic gate (HKMG) material.

An embodiment further includes expanding the inner spacer cavity by an etching process. In an embodiment, expanding the inner spacer cavity includes using an isotropic wet etching process. An embodiment further includes depositing a gate liner upon the fin. An embodiment further includes etching the gate liner from the fin.

In an embodiment, forming the top sacrificial spacer upon the fin and the trench region includes depositing the top sacrificial spacer upon the fin and the trench region. In an embodiment, etching the top sacrificial spacer to form the trench in the trench region and remove the portions of the top sacrificial layer includes a reactive-ion etching (RIE) process.

In an embodiment, etching the sacrificial top spacer and sacrificial inner spacer includes a wet etching process. In an embodiment, the final top spacer is formed of a low dielectric constant (low-K) material. In an embodiment, the set of nanosheet layers are stacked upon an isolation layer, and wherein the isolation layer is disposed upon the substrate.

An embodiment of an apparatus includes a substrate structure having a set of nanosheet layers stacked upon a substrate, the set of nanosheet layers including at least one silicon (Si) layer and at least one silicon-germanium (SiGe) layer, wherein the substrate structure further includes a fin formed in the stacked set of nanosheet layers, a gate region formed within the fin, and a trench region adjacent to the fin, the trench region including a trench formed therein. The embodiment further includes a source/drain (S/D) region formed within the trench. The embodiment further includes an inner spacer cavity formed between the S/D region and the at least one SiGe layer, the inner spacer cavity being formed by removing portions of a sacrificial top spacer formed upon the fin and the trench region and removing portions of a sacrificial inner spacer formed within an indentation of the at least one SiGe layer in the trench region. The embodiment further includes a top spacer formed on the fin, and an inner spacer formed within the inner spacer cavity.

An embodiment includes a computer usable program product. The computer usable program product includes one or more computer-readable storage devices, and program instructions stored on at least one of the one or more storage devices.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
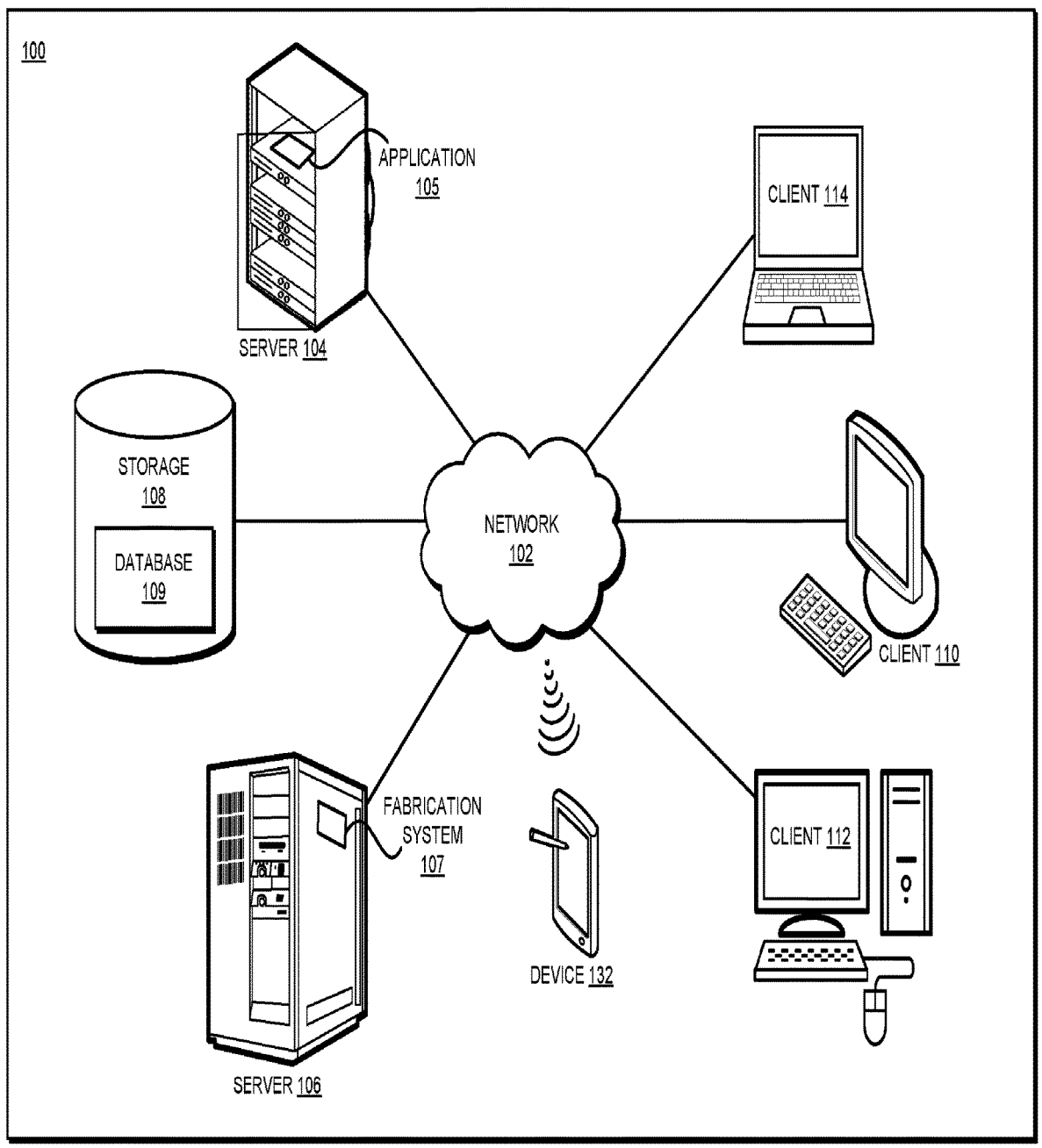
FIG. 1 depicts a block diagram of a network of data processing systems in which illustrative embodiments may be implemented.

The illustrative embodiments relate to a method for fabricating nanosheet transistors using a sacrificial spacer and inner spacers and a structure formed by the method. The illustrative embodiments recognize that the present methods and techniques for fabricating nanosheet transistors suffer from several problems. For example, forming inner spacers, particularly those requiring tight design ground rules, is challenging. Inner spacers are essential for nanosheet FETs (NSFETs). In addition to the classic function of spacers which electrically isolate the gate from the source/drain (S/D), the inner spacers in NSFETs also serve the purpose of protecting the source/drain epitaxy during nanosheet release (e.g., removing the sacrificial silicon-germanium (SiGe) in the channel region).

The illustrative embodiments recognize that current processes for fabricating NSFETs leads to non-ideal inner spacers, which in turn may lead to the loss of source/drain epitaxy (particularly SiGe S/D epitaxy for pFETs) when the sacrificial SiGe in the channel region is removed. The loss of S/D epitaxy may result in high resistance and even electrical shorts between S/D contacts and the gate. Inner spacers profile is fixed during an indention step of fabrication. A box-shaped profile is often desired to provide optimal S/D channel control and variability and to provide protection of the S/D epitaxy during channel release. However, in actual practice inner spacers are often formed in a half-moon shape resulting in the inner spacers being very thin close to the Si/SiGE:B interface. In addition, HCl leakage through meniscuses often etches the pFET S/D epitaxy away in the replacement metal gate (RMG) during channel release. Certain embodiments used to describe the invention generally address and solve one or more of the above-described problems and other problems related to fabricating nanosheet transistors.

In one or more embodiments, a sacrificial silicon nitride (SiN) top spacer and sacrificial inner spacers are formed on a nanosheet stack and used to grow pFET/nFET dual epitaxy to form the source/drain (S/D) regions. In the embodiments, the sacrificial SiN top spacer and inner spacers are removed to re-open inner spacer cavities. In the embodiments, the inner spacer cavities are expanded by recessing sacrificial SiGe in the channel region and the S/D epitaxy to ensure complete separation of the channel region and S/D epitaxy region. In the embodiment, a final top spacer an inner spacers are formed using a conformal deposition of a low dielectric constant (low-K) material.

An embodiment can be implemented as a software application. The application implementing an embodiment can be configured as a modification of an existing fabrication system, as a separate application that operates in conjunction with an existing fabrication system, a standalone application, or some combination thereof. For example, the application causes the fabrication system to perform the steps described herein, to fabricate nanosheet transistors.

For the clarity of the description, and without implying any limitation thereto, the illustrative embodiments are described using FET a nanosheet transistor disposed on a substrate. An embodiment can be implemented with different types and/or numbers of nanosheet transistors, a number of gates, and/or a different number of substrates within the scope of the illustrative embodiments.

Furthermore, a simplified diagram of the example nanosheet FETs are used in the figures and the illustrative embodiments. In an actual fabrication of a nanosheet transistors, additional structures that are not shown or described herein may be present without departing the scope of the illustrative embodiments. Similarly, within the scope of the illustrative embodiments, a shown or described structure in the example nanosheet transistors may be fabricated differently to yield a similar operation or result as described herein.

Differently shaded portions in the two-dimensional drawing of the example nanosheet transistors are intended to represent different structures in the example nanosheet transistors, as described herein. The different structures may be fabricated using suitable materials that are known to those of ordinary skill in the art.

A specific shape or dimension of a shape depicted herein is not intended to be limiting on the illustrative embodiments. The shapes and dimensions are chosen only for the clarity of the drawings and the description and may have been exaggerated, minimized, or otherwise changed from actual shapes and dimensions that might be used in actually fabricating nanosheet transistors according to the illustrative embodiments.

Furthermore, the illustrative embodiments are described with respect to nanosheet transistors only as an example. The steps described by the various illustrative embodiments can be adapted for fabricating other planar and non-planar devices employing nanosheets in a similar manner, and such adaptations are contemplated within the scope of the illustrative embodiments.

An embodiment when implemented in an application causes a fabrication process to performs certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

A method of an embodiment described herein, when implemented to execute on a device or data processing system, comprises substantial advancement of the functionality of that device or data processing system in fabricating nanosheet transistor devices. An embodiment provides a method for fabricating nanosheet transistors.

The illustrative embodiments are described with respect to certain types of devices, contacts, layers, planes, structures, materials, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
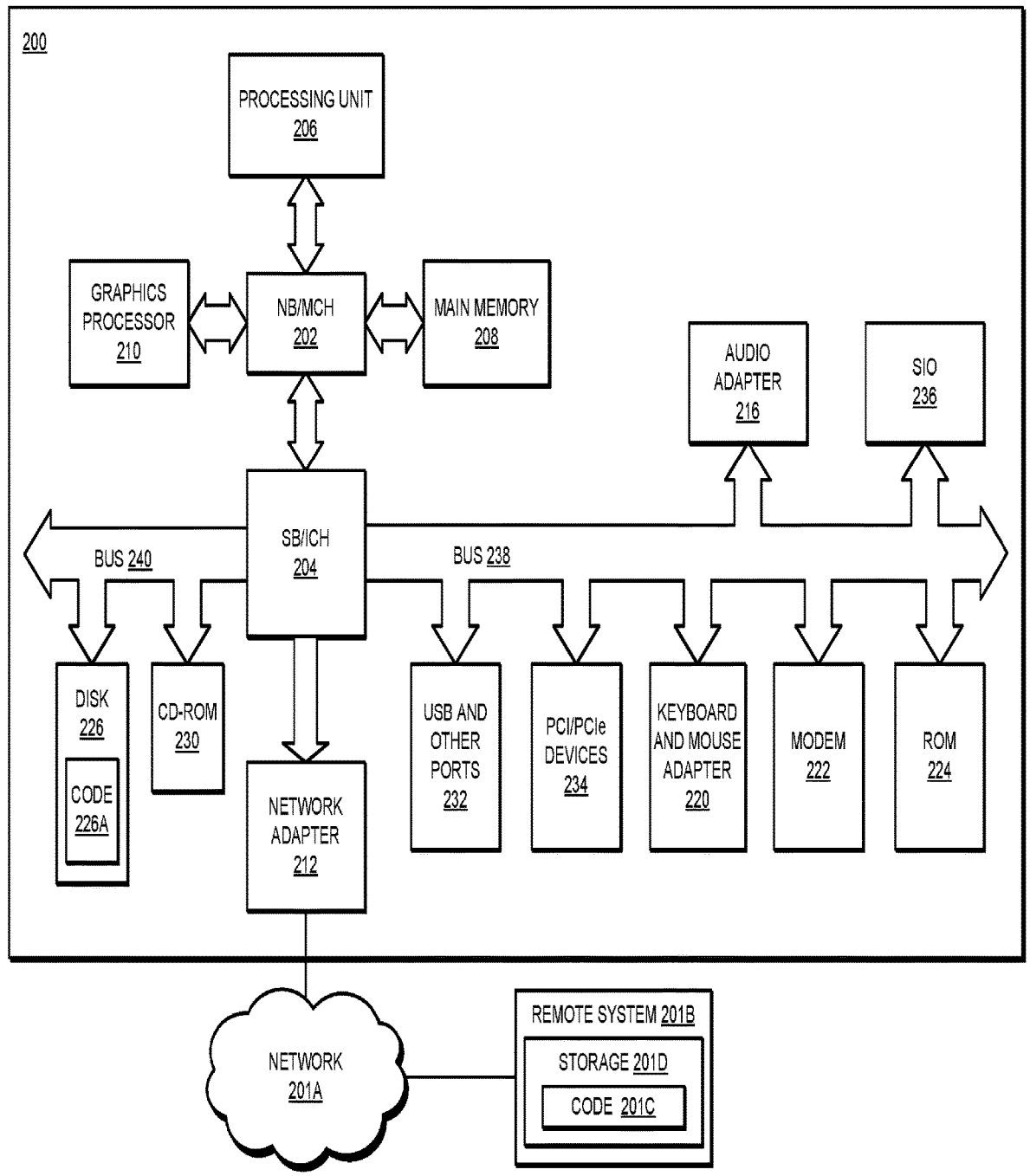
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Application 105 implements an embodiment described herein. Fabrication system 107 is any suitable system for fabricating a semiconductor device. Application 105 provides instructions to system 107 for fabricating one or more nanosheet transistors in a manner described herein.

Servers 104 and 106, storage unit 108, and clients 110, 112, and 114 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system such as AIX® (AIX is a trademark of International Business Machines Corporation in the United States and other countries), Microsoft® Windows® (Microsoft and Windows are trademarks of Microsoft Corporation in the United States and other countries), Linux® (Linux is a trademark of Linus Torvalds in the United States and other countries), iOS™ (iOS is a trademark of Cisco Systems, Inc. licensed to Apple Inc. in the United States and in other countries), or Android™ (Android is a trademark of Google Inc., in the United States and in other countries). An object oriented programming system, such as the Java™ programming system, may run in conjunction with the operating system and provide calls to the operating system from Java™ programs or applications executing on data processing system 200 (Java and all Java-based trademarks and logos are trademarks or registered trademarks of Oracle Corporation and/or its affiliates).

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. In another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

With reference to FIGS. 3-16, these figures depict an example process for fabricating nanosheet transistors in accordance with one or more illustrative embodiments. In the particular embodiments illustrated in FIGS. 4-14, a single NFET and a single PFET are fabricated upon a substrate and/or wafer. It should be understood that in other embodiments, any combination of NFETs and PFETs or other combinations of any numbers of nanosheet semiconductor devices, may be fabricated on a substrate in a similar manner.

Figure 3:
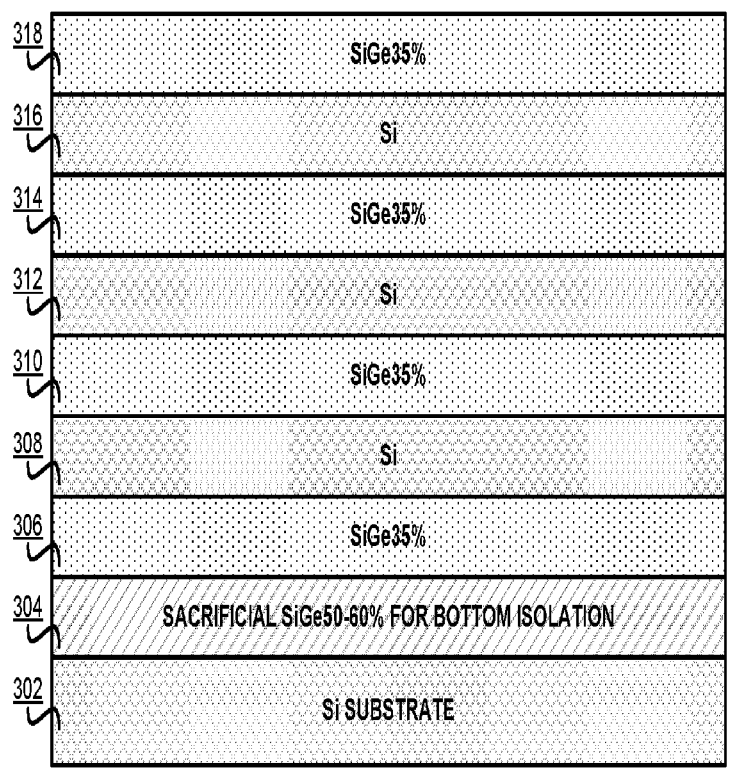
FIG. 3 depicts a cross-section view of a portion of a process according to an illustrative embodiment.

With reference to FIG. 3, this figure depicts a cross-section view of a portion of a process in which an example substrate structure 300 is received according to an illustrative embodiment. Substrate structure 300 includes a substrate layer 302, a dielectric isolation layer 304 formed on substrate layer 302, a first silicon-germanium (SiGe) layer 306 formed on dielectric isolation layer 304, a first silicon (Si) layer 308 formed on first SiGe layer 306, a second SiGe layer 310 formed on first Si layer 308, a second Si layer 312 formed on second SiGe layer 310, a third SiGe layer 314 formed on second Si layer 312, a third Si layer 316 formed on third SiGe layer 314, and a fourth SiGe layer 318 formed on third Si layer 316. In a particular embodiment, the layers of the nanosheet stack are formed by epitaxial growth. In a particular embodiment, SiGE layers 306, 310, 314 have a dopant concentration of 35%. In a particular embodiment, dielectric isolation layer 304 has an SiGe dopant concentration of 50-60%. It should be understood that in other embodiments, other dopant concentrations could be used. Although embodiments described herein are shown as using three Si layers and three SiGe layers in the nanosheet stack, it should be understood that in other embodiments any desired number of layers forming the nanosheet stack may be used.

Figure 4:
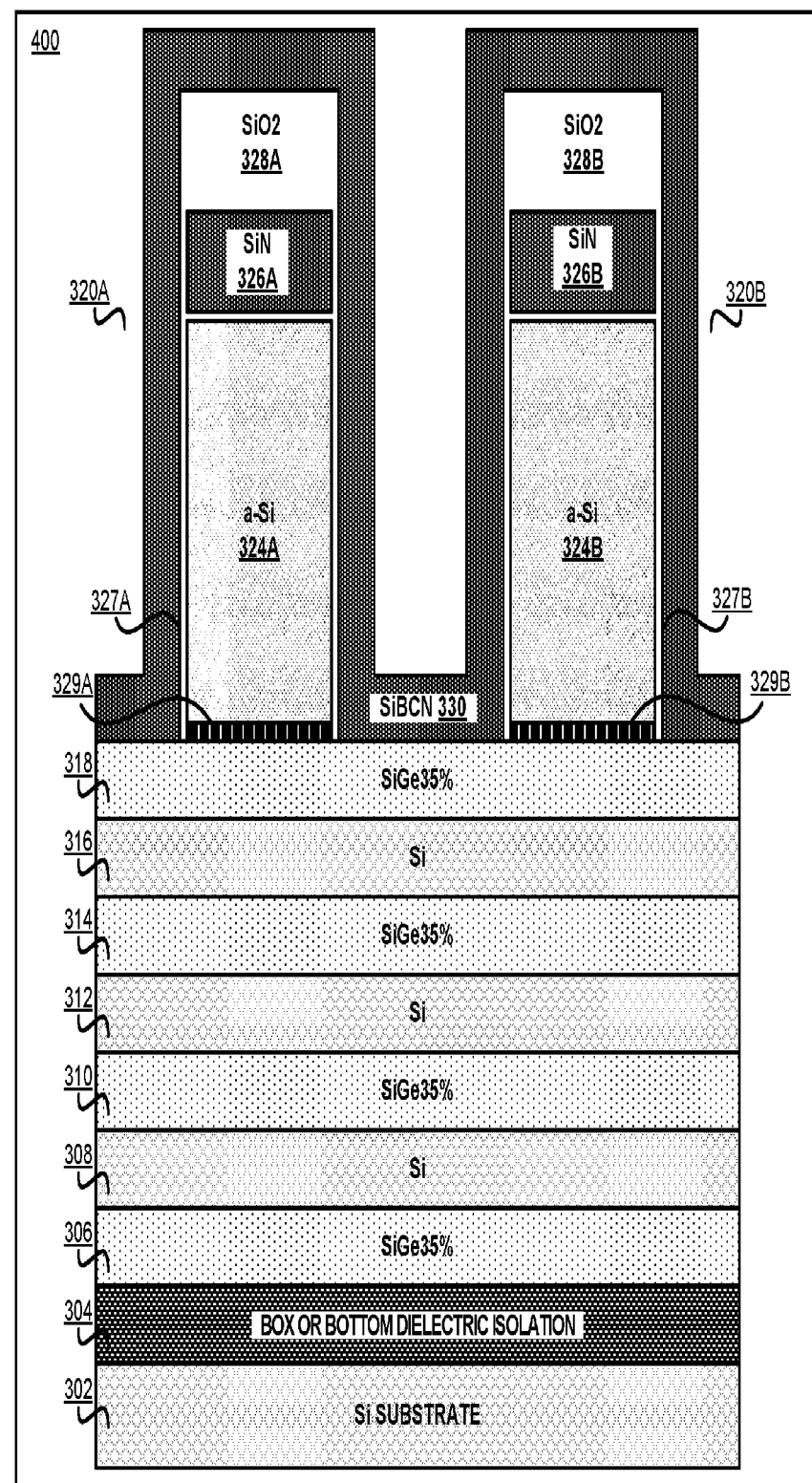
FIG. 4 depicts a cross-section view of another portion of a process according to an illustrative embodiment.

With reference to FIG. 4, FIG. 4 depicts a cross-section view of another portion of a process in which a structure 400 is formed according to an embodiment. In the embodiment, a first fin 320a, a second fin 320b, a shallow trench isolation (STI) trench 322, a first gate region 324a, and a second gate region 324b are formed within the nanosheet stack. In the embodiment, a SiN conformal layer 326a and a silicon dioxide (SiO2) gate liner 327a, 328a is deposited upon first fin 320a, and a SiN conformal layer 326b and SiO2 gate liner 327b, 328b is deposited upon second fin 320b. In the embodiment, a top sacrificial spacer 330 is deposited upon first fin 320a, second fin 320b, and trench 322. In a particular embodiment, the top sacrificial spacer is formed of a siliconborocarbonitride (SiBCN) material. In a particular embodiment, gate liner 327a, 327b may have a thickness of approximately 2 nm. In the embodiment, a first dummy oxide layer 329A is deposited between first gate region 324A and fourth SiGe layer 318, and a second dummy oxide layer 329B is deposited between second gate region 324B and fourth SiGe layer 318. In a particular embodiment, first dummy oxide layer 329A and second dummy oxide layer 329B are formed of a SiO2 material.

Figure 5:
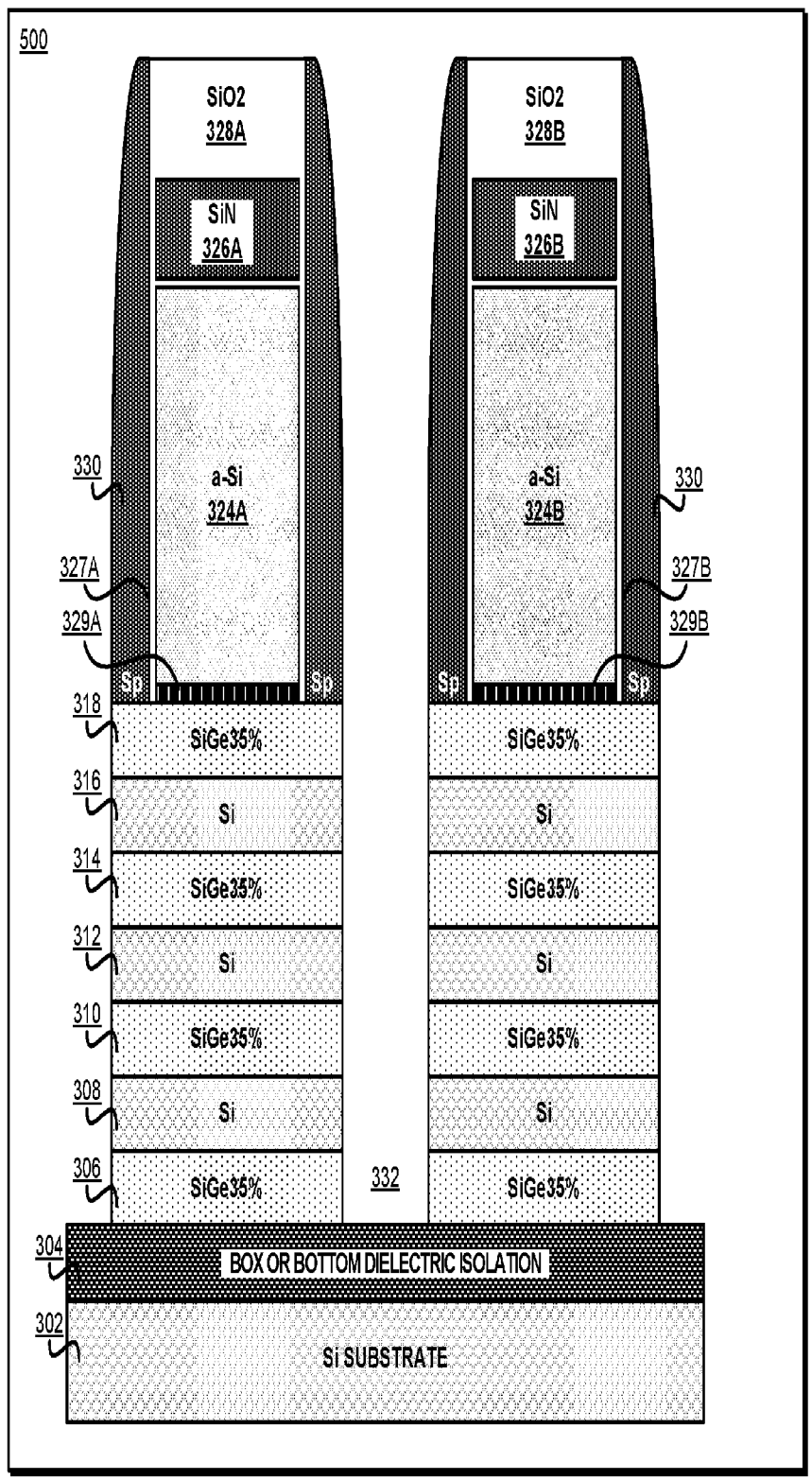
FIG. 5 depicts a cross-section view of another portion of a process according to an illustrative embodiment.

With reference to FIG. 5, FIG. 5 depicts a cross-section view of another portion of a process in which a structure 500 is formed according to an embodiment. In the embodiment, top sacrificial spacer 330 and fins 320a, 320b are etched by an etching process such as by a reactive-ion etching (RIE) process to form a trench 332 between fins 320a, 320b down to bottom dielectric isolation layer 304 and substantially remove top sacrificial layer 330 from the nanosheet stack except for portions deposited on sides of fins 320a, 320b.

Figure 6:
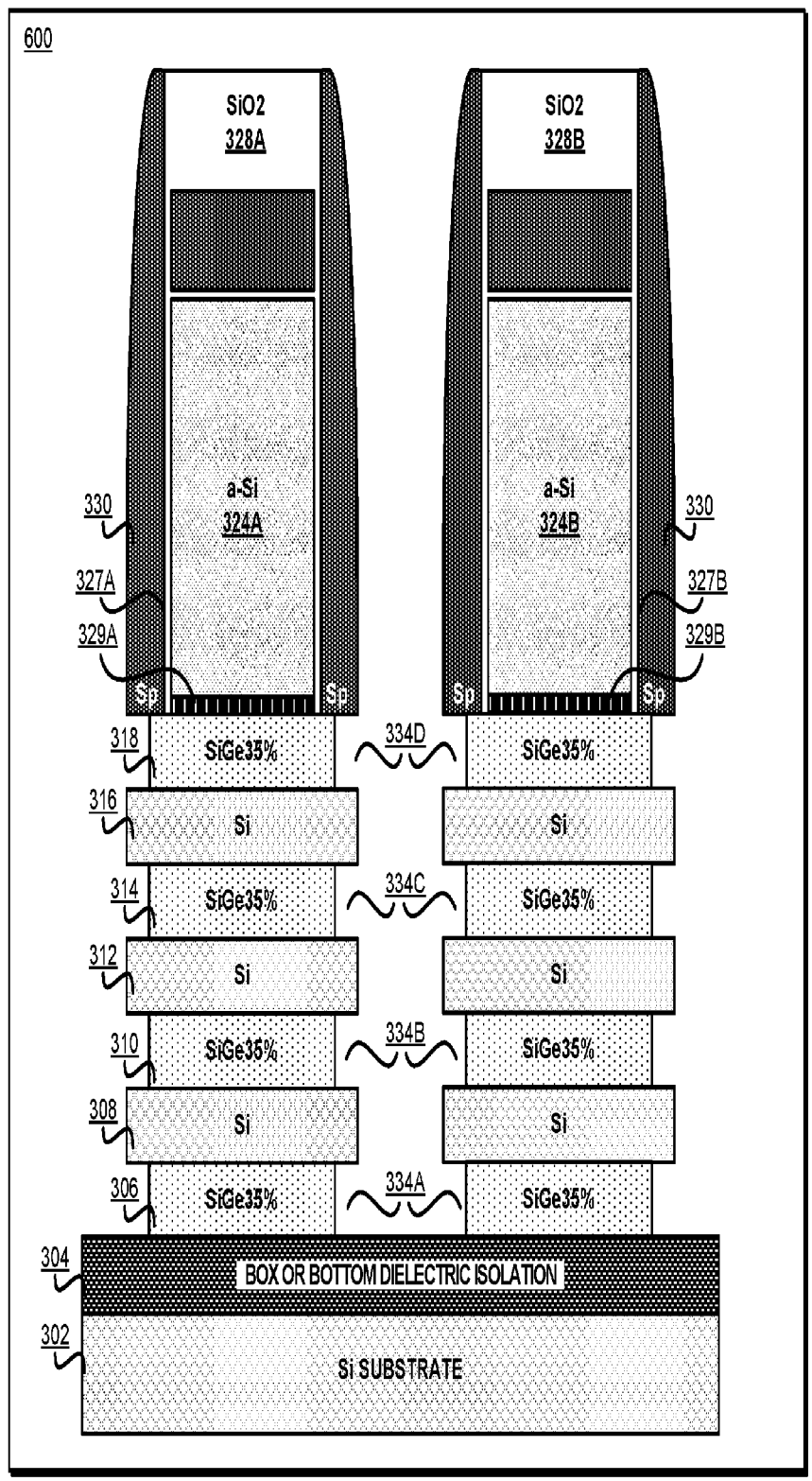
FIG. 6 depicts a cross-section view of another portion of a process according to an illustrative embodiment.

With reference to FIG. 6, FIG. 6 depicts a cross-section view of another portion of a process in which a structure 600 is formed according to an embodiment. In the embodiment, inner spacer shallow indentations 334a-334d are formed within SiGe layers 306, 310, 314, 318 by an etching process without substantially affecting Si layers 308, 312, 316 of the nanosheet stack. In a particular embodiment, inner spacer shallow indentations 334a-334d are formed by a wet etching process such as a SC1@40C-400s process.

Figure 7:
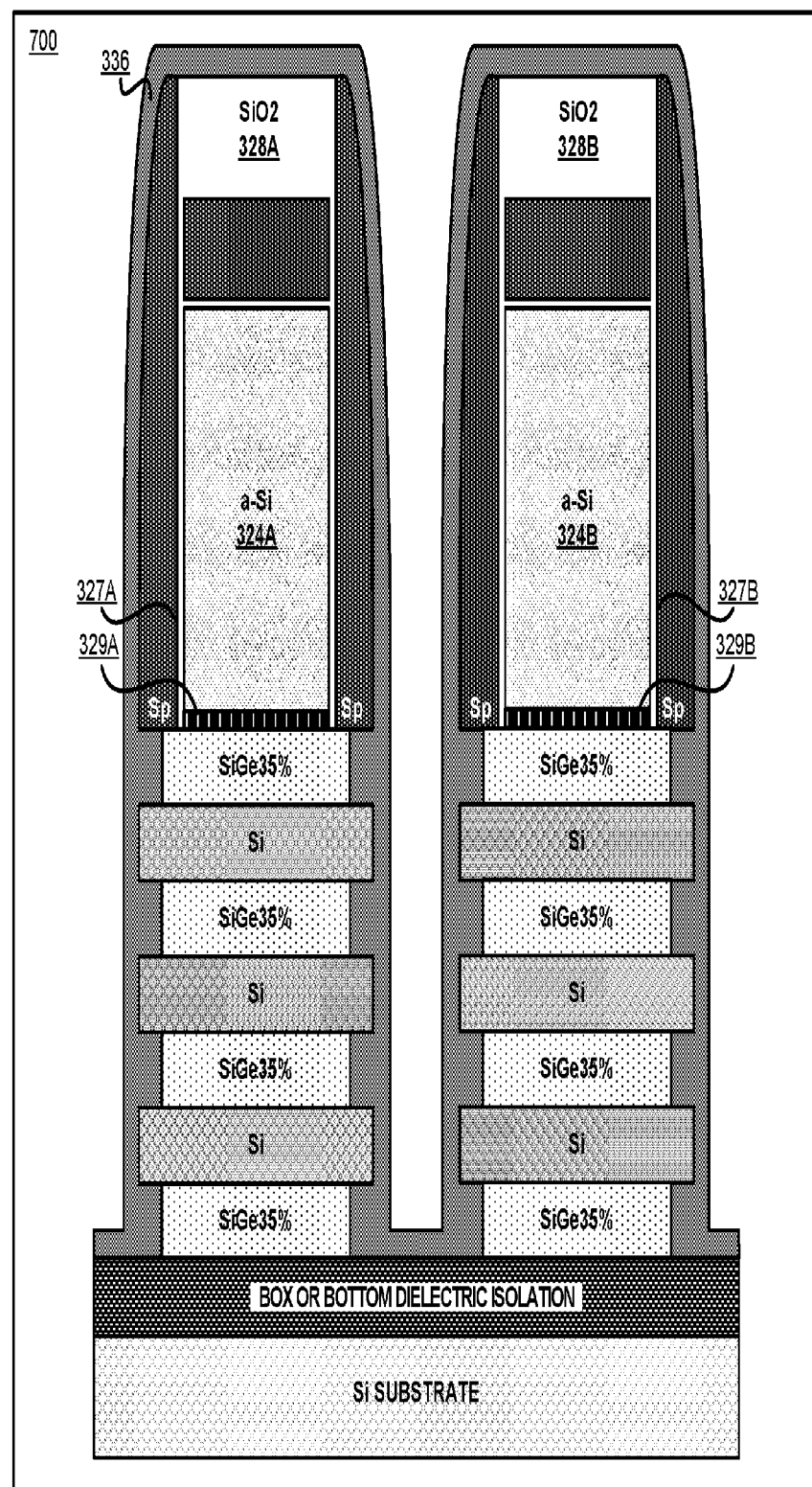
FIG. 7 depicts a cross-section view of another portion of a process according to an illustrative embodiment.

With reference to FIG. 7, FIG. 7 depicts a cross-section view of another portion of a process in which a structure 700 is formed according to an embodiment. In the embodiment, a sacrificial inner spacer 336 is formed on fins 320a, 320b by a conformal deposition process. In a particular embodiment, sacrificial inner spacer 336 is formed by a conformal In-situ Radical assisted deposition (iRAD) process.

Figure 8:
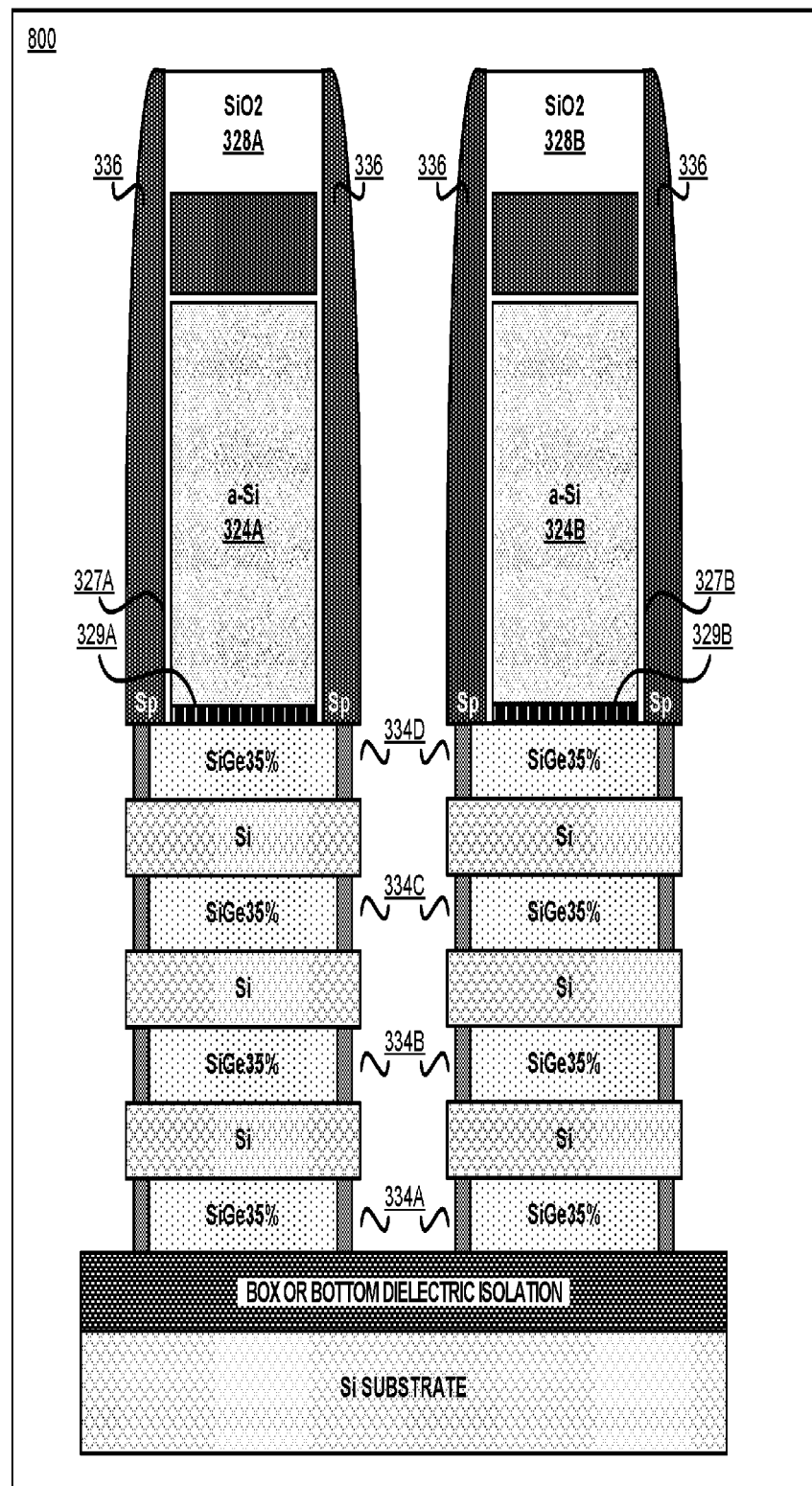
FIG. 8 depicts a cross-section view of another portion of a process according to an illustrative embodiment.

With reference to FIG. 8, FIG. 8 depicts a cross-section view of another portion of a process in which a structure 800 is formed according to an embodiment. In the embodiment, sacrificial inner spacer 330 is over-etched to substantially remove the portions of sacrificial inner spacer 330 from inner spacer shallow indentations 334a-334d except for a portion of sacrificial inner spacer 330 deposited upon the SiGe layers of the nanosheet stack while leaving the portions of sacrificial inner spacer 330 upon the gate portions of the fins. In a particular embodiment, sacrificial inner spacer 330 is over-etched by a wet-etching process such as by using isotropic phosphoric acid (H3PO4) as an etching agent at a temperature of 165C.

Figure 9:
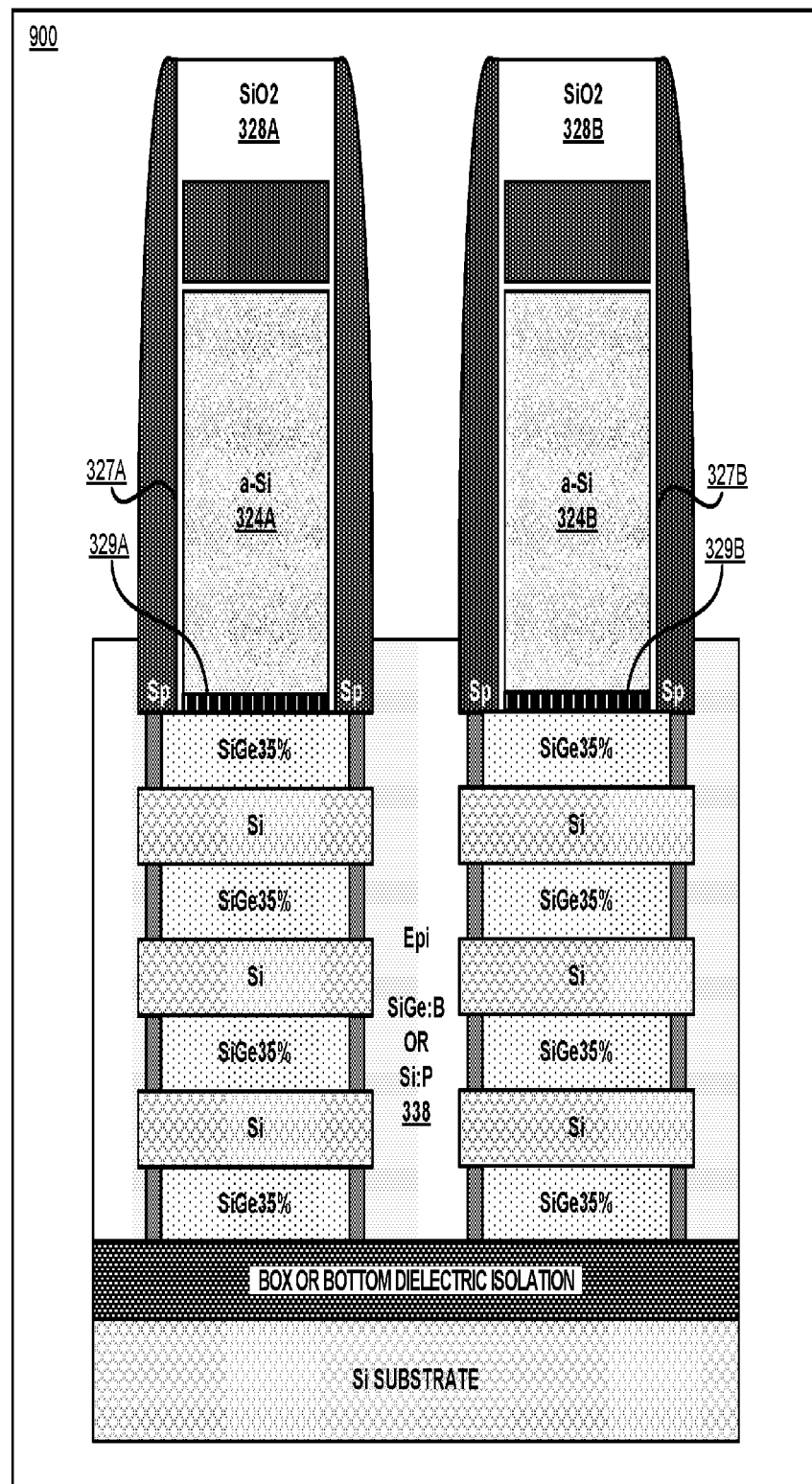
FIG. 9 depicts a cross-section view of another portion of a process according to an illustrative embodiment.

With reference to FIG. 9, FIG. 9 depicts a cross-section view of another portion of a process in which a structure 900 is formed according to an embodiment. In the embodiment, NFET/PFET S/D region 338 is formed within trench 332 between fins 320a, 320b by dual epitaxial growth.

Figure 10:
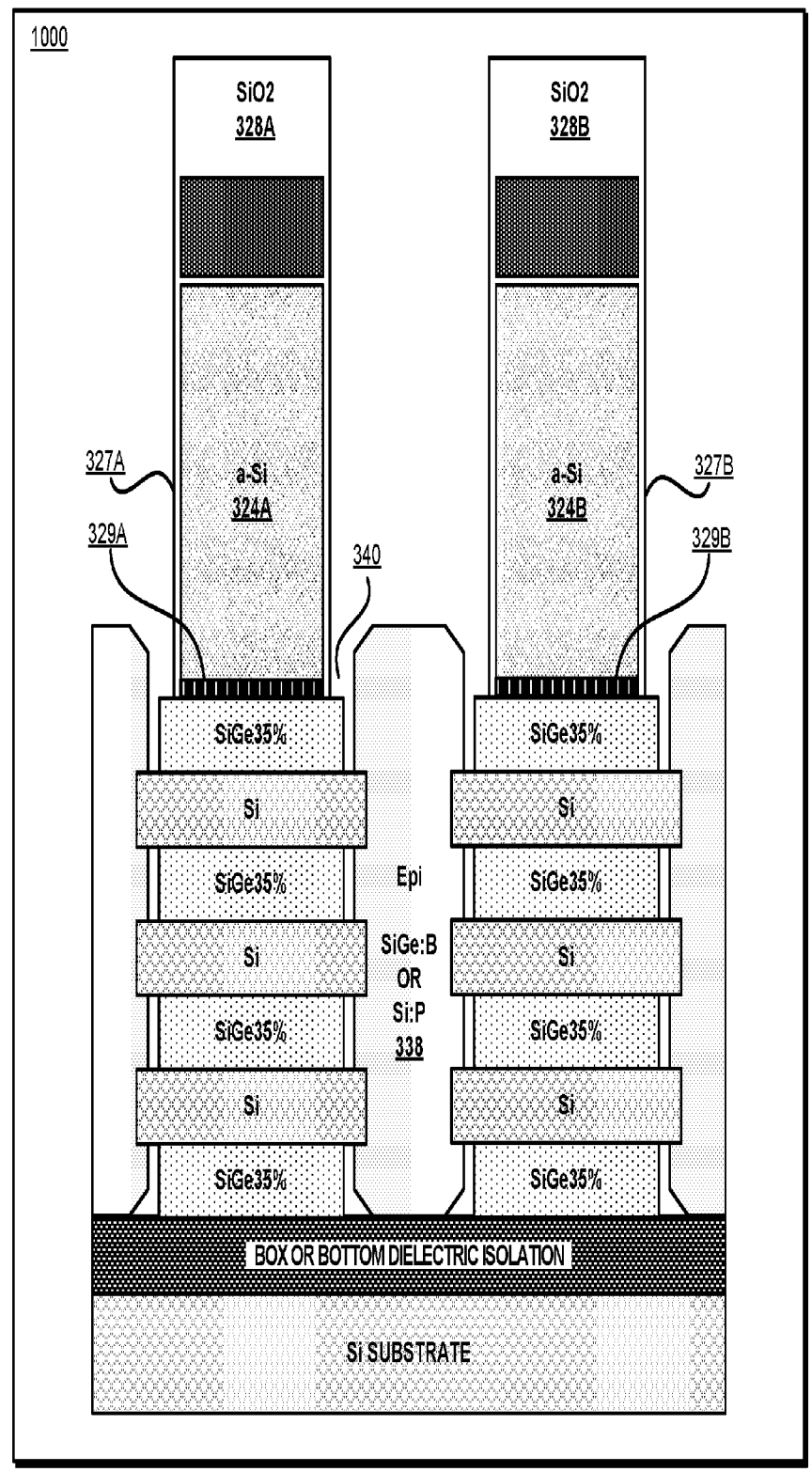
FIG. 10 depicts a cross-section view of another portion of a process according to an illustrative embodiment.

With reference to FIG. 10, FIG. 10 depicts a cross-section view of another portion of a process in which a structure 1000 is formed according to an embodiment. In the embodiment, sacrificial top spacer 330 and sacrificial inner spacer 360 are etched back to form inner spacer cavities 340 between NFET/PFET region S/D region 338 and SiGe layers 306, 310, 314, 318.

Figure 11:
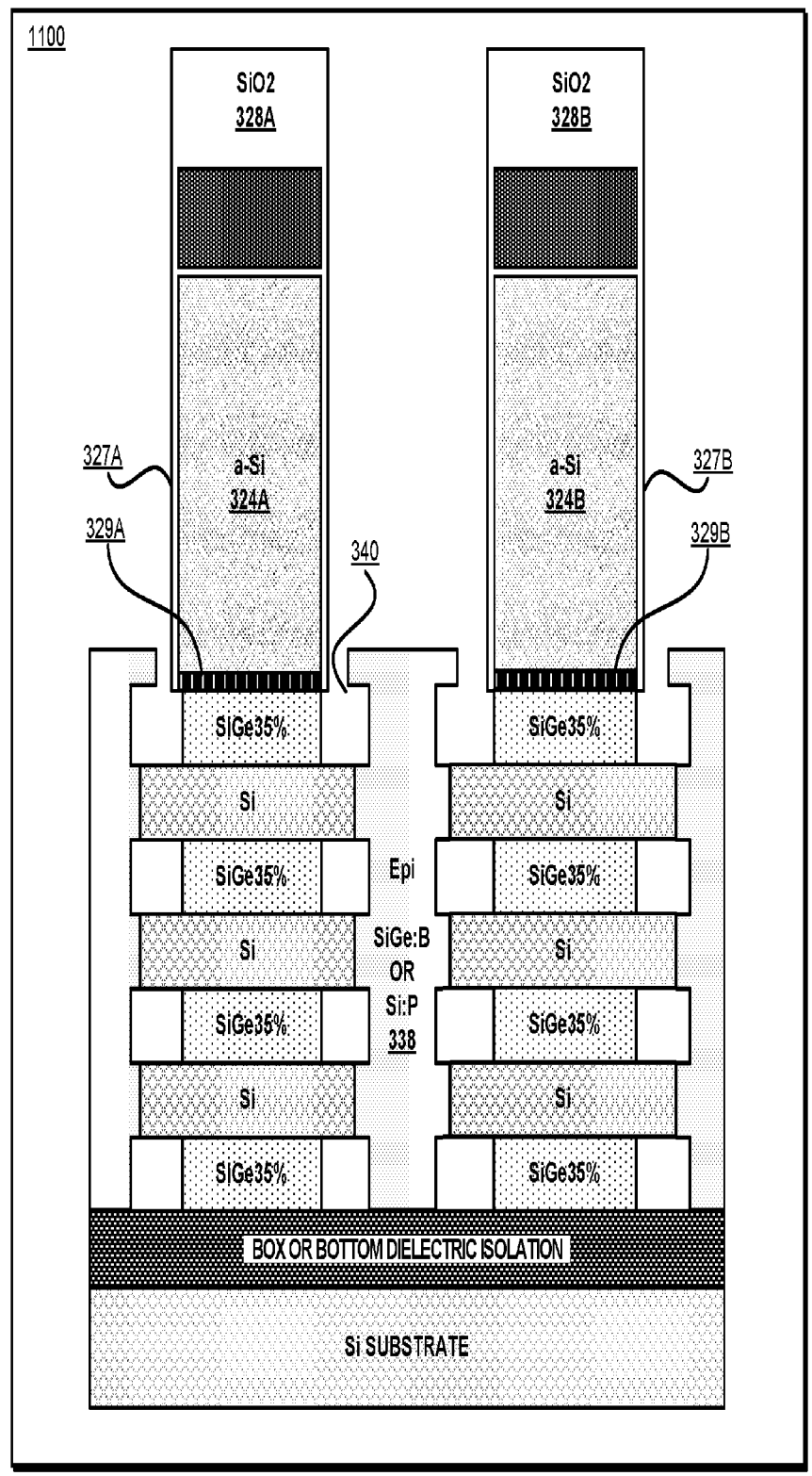
FIG. 11 depicts a cross-section view of another portion of a process according to an illustrative embodiment.

With reference to FIG. 11, FIG. 11 depicts a cross-section view of another portion of a process in which a structure 1100 is formed according to an embodiment. In the embodiment, inner spacer cavities 340 are expanded by an etching process. In a particular embodiment, inner spacer cavities 340 are expanded by an isotropic wet etching process such as a SC1-40C or using a hydrochloric acid(HCl)etching agent. In an alternative embodiment, inner spacer cavities 340 are expanded by a low-T oxidation process followed by an oxide etch.

Figure 12:
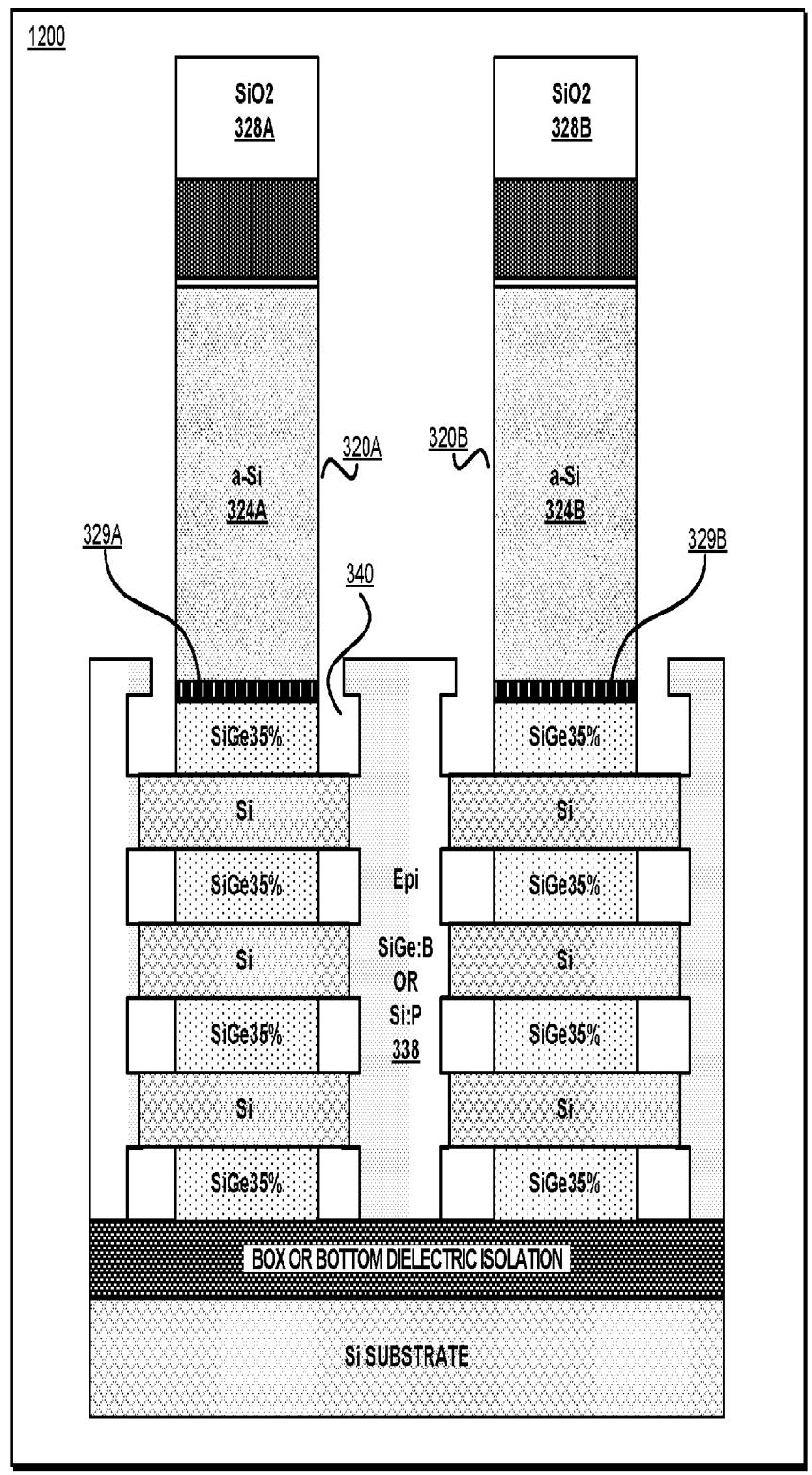
FIG. 12 depicts a cross-section view of another portion of a process according to an illustrative embodiment.

With reference to FIG. 12, FIG. 12 depicts a cross-section view of another portion of a process in which a structure 1200 is formed according to an embodiment. In the embodiment SiO2 gate liners 327a, 327b are etched back to substantially remove SiO2 gate liners 327a, 327b from fins 320a, 320b.

Figure 13:
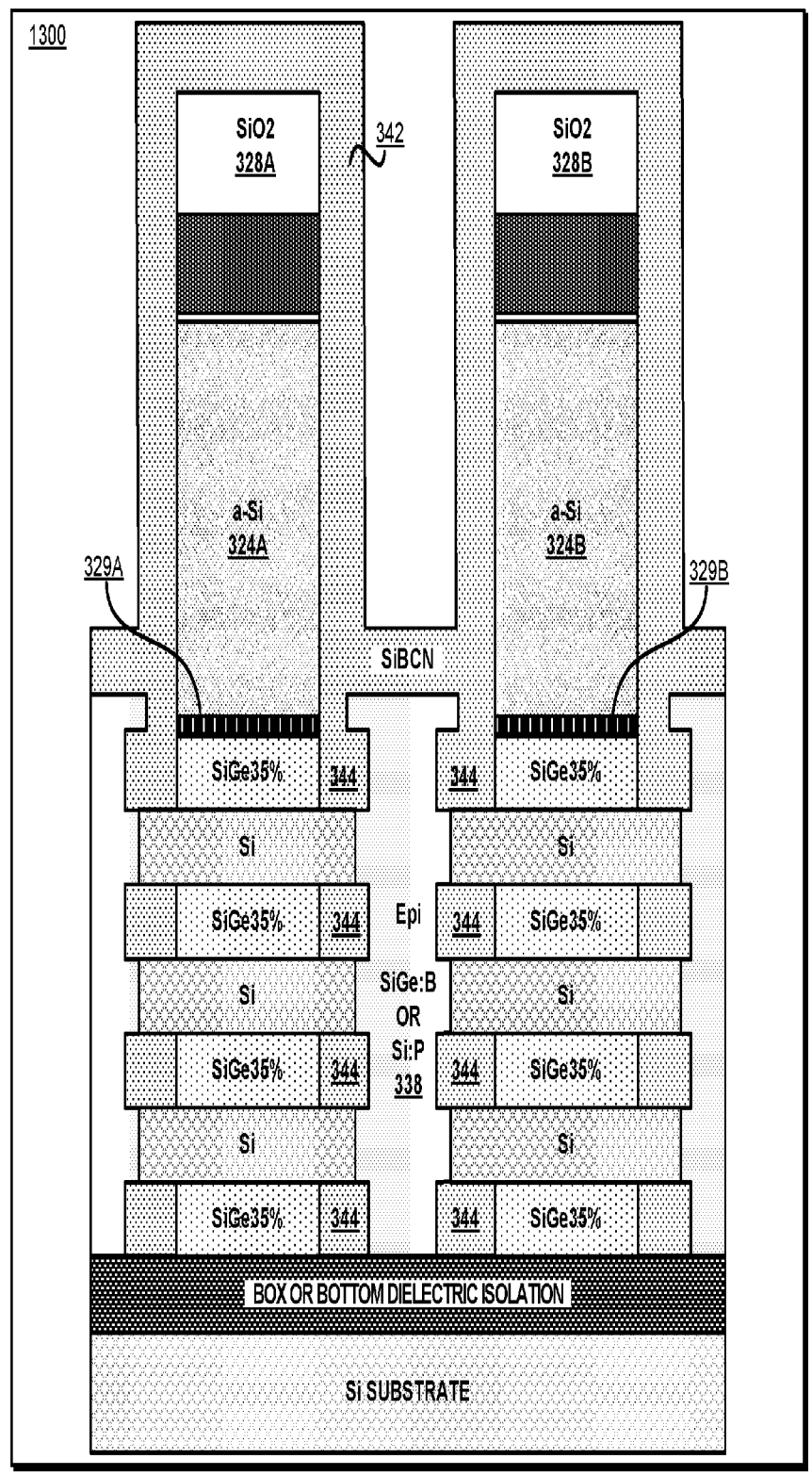
FIG. 13 depicts a cross-section view of another portion of a process according to an illustrative embodiment.

With reference to FIG. 13, FIG. 13 depicts a cross-section view of another portion of a process in which a structure 1300 is formed according to an embodiment. In the embodiment, a final low-K spacer 342 is formed on fins 320a, 320b. In the embodiment, inner spacers 344 are formed within inner spacer cavities 340. In a particular embodiment, low-K spacer 342 and inner spacers 344 are formed by a conformal deposition process such as by an iRad process. In a particular embodiment, low-K spacer 342 and inner spacers 344 are formed of a SiBCN material.

Figure 14:
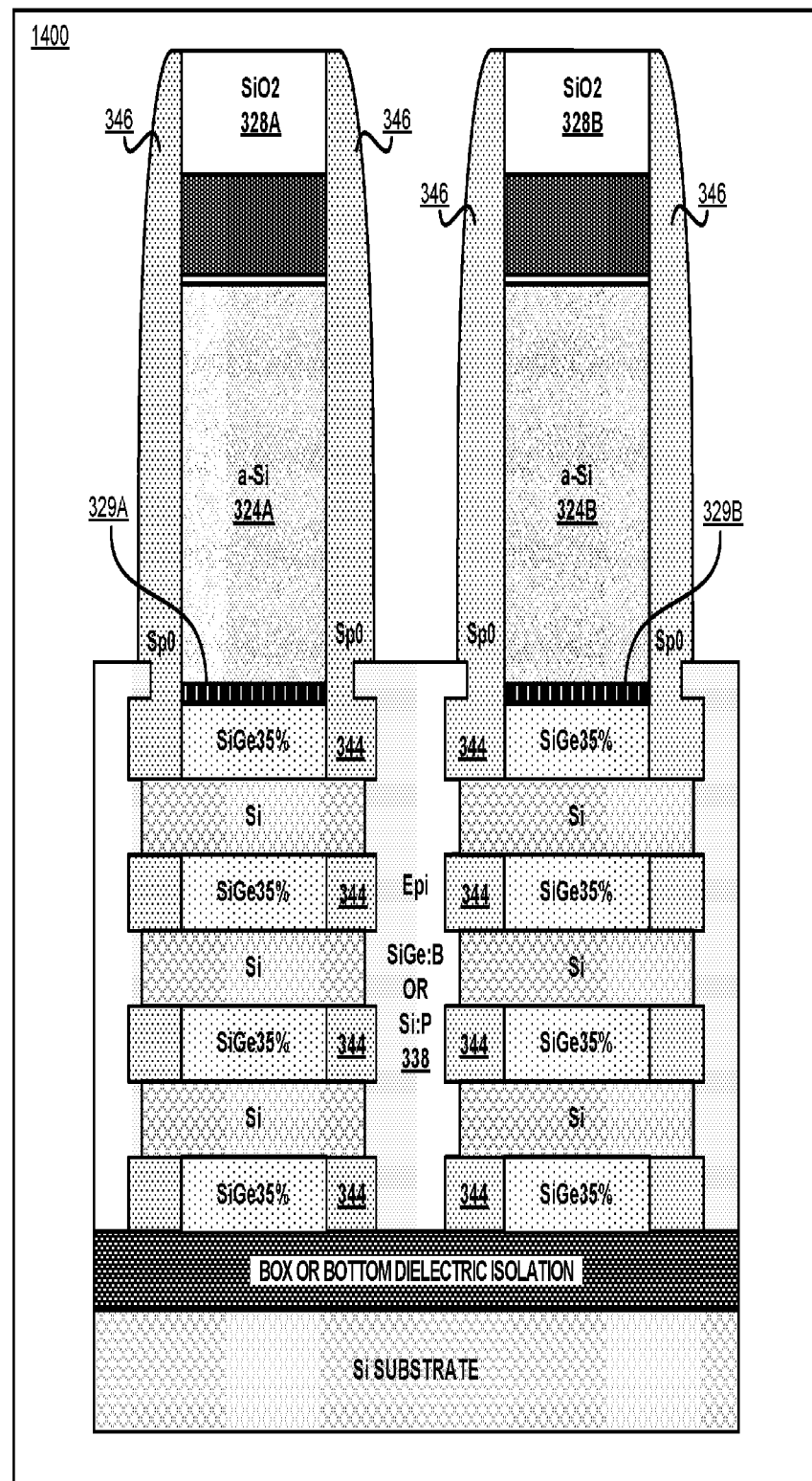
FIG. 14 depicts a cross-section view of another portion of a process according to an illustrative embodiment.

With reference to FIG. 14, FIG. 14 depicts a cross-section view of another portion of a process in which a structure 1400 is formed according to an embodiment. In the embodiment, a final top spacer 346 is formed by etching low-K spacer 342. In a particular embodiment, final top spacer 346 is formed by an RIE process.

Figure 15:
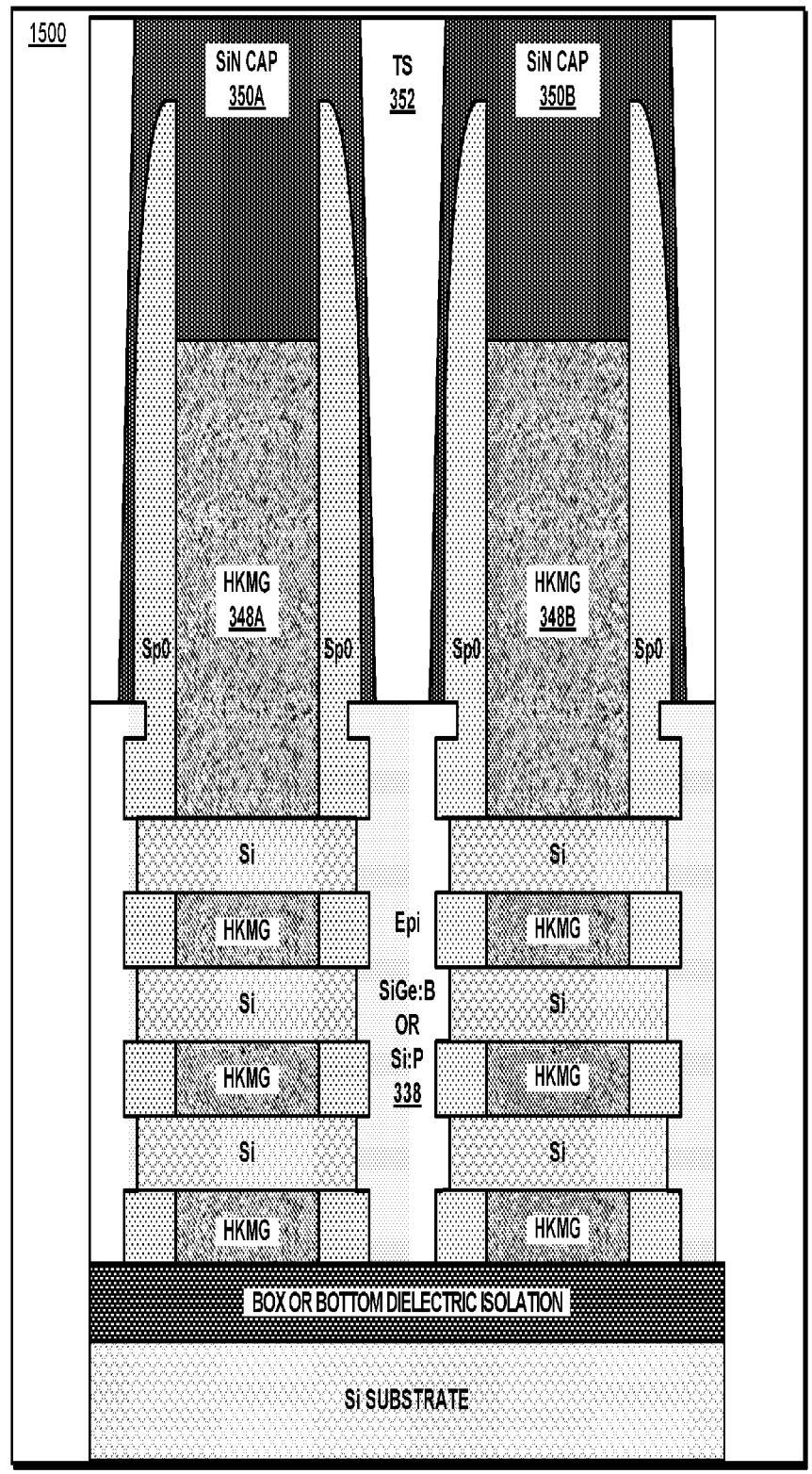
FIG. 15 depicts a cross-section view of an optional portion of a process according to an illustrative embodiment.

With reference to FIG. 15, FIG. 15 depicts a cross-section view of another portion of a process in which a structure 1500 is formed according to an embodiment. In the embodiment, a high-K metallic gate (HKMG) material 348a, 348b or other work function metal (WFM) is implanted within each of first gate region 324a and second gate region 324b to form gates for the nanosheet transistor. In the embodiment, a SiN cap 350a and 350b is deposited upon each of HKMG material 348a, 348b. In the embodiment, contact (TS) 352 is formed on NFET/PFET S/D region 338. As a result an nanosheet transistor is fabricated.

Figure 16:
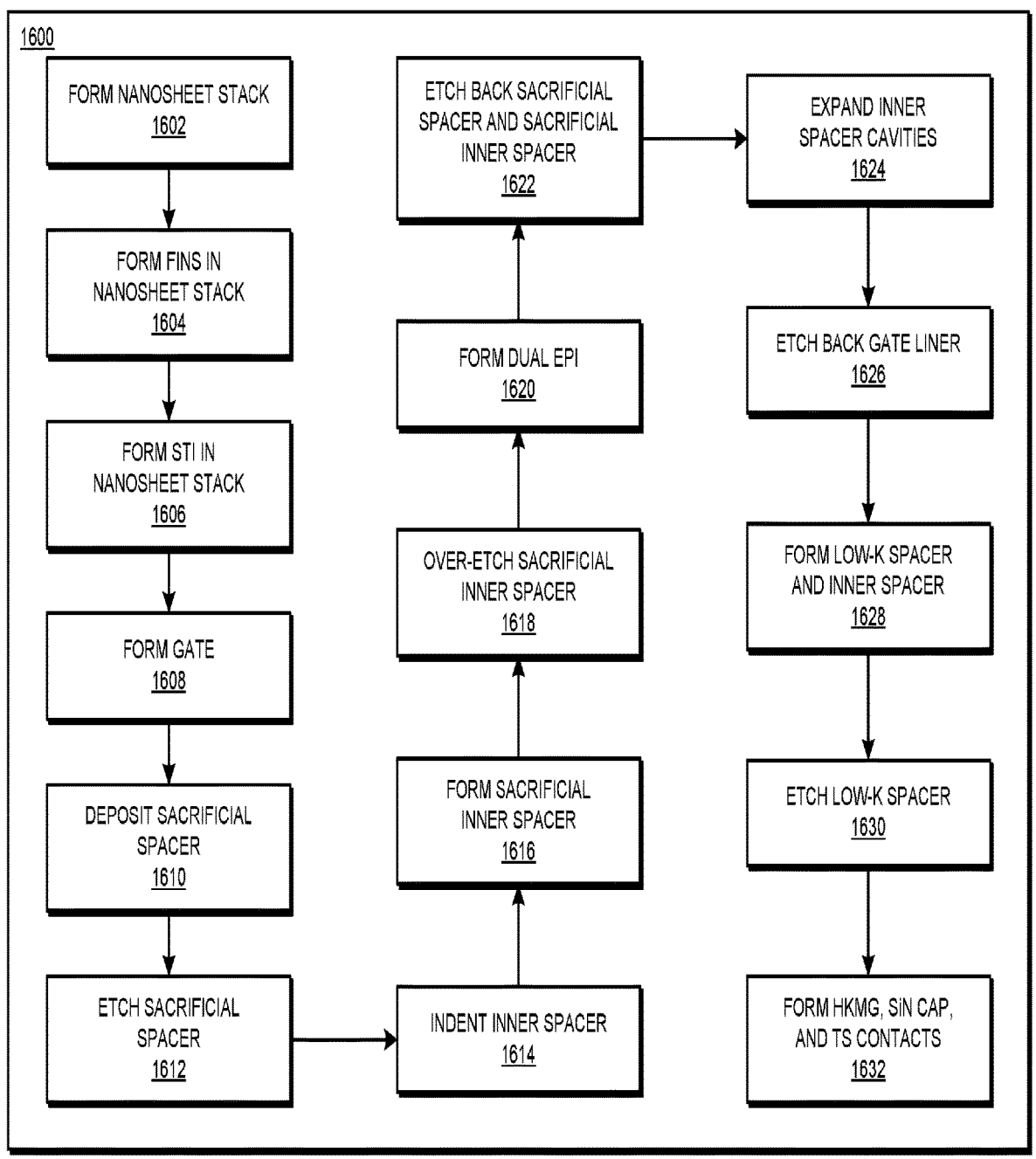
FIG. 16 depicts a flowchart of an example process for fabricating nanosheet transistors in accordance with an illustrative embodiment.

With reference to FIG. 16, FIG. 16 depicts a flowchart of an example process 1600 for fabricating nanosheet transistors in accordance with one or more illustrative embodiments. Process 1600 can be implemented in fabrication system 107 in FIG. 1, to perform one or more steps of FIGS. 3-14 as needed in process 1600.

In block 1602, fabrication system 107 forms a nanosheet stack including substrate layer 302, dielectric isolation layer 304 formed on substrate layer 302, first silicon-germanium (SiGe) layer 306 formed on dielectric isolation layer 304, first silicon (Si) layer 308 formed on first SiGe layer 306, second SiGe layer 310 formed on first Si layer 308, second Si layer 312 formed on second SiGe layer 310, third SiGe layer 314 formed on second Si layer 312, third Si layer 316 formed on third SiGe layer 314, and fourth SiGe layer 318 formed on third Si layer 316. In a particular embodiment, the layers of the nanosheet stack are formed by epitaxial growth.

In block 1604, fabrication system 107 forms first fin 320a, and second fin 320b in the nanosheet stack. In block 1606, fabrication system 107 forms STI trench 322 in the nanosheet stack between and adjacent to fins 320a, 320b. In block 1608, fabrication system 107 forms a first gate region 324a, and a second gate region 324b within fins 320a, 320b, respectively of nanosheet stack. In a particular embodiment, fabrication system 107 deposits SiN conformal layer 326a and SiO2 gate liner 328a upon first fin 320a, and SiN conformal layer 326b and SiO2 liner 328b is deposited upon second fin 320b.

In block 1610, fabrication system 107 deposits top sacrificial spacer 330 upon first fin 320a, second fin 320b, and trench 322. In a particular embodiment, the top sacrificial spacer is formed of a siliconborocarbonitride (SiBCN) material. In block 1612, fabrication system 107 etches top sacrificial spacer 330 and fins 320a, 320b by an etching process such as by an RIE process to form trench 332 between fins 320a, 320b down to bottom dielectric isolation layer 304 and substantially remove top sacrificial layer 330 from the nanosheet stack except for portions deposited on sides of fins 320a, 320b.

In block 1614, fabrication system 107 forms inner spacer shallow indentations 334a-334d within SiGe layers 306, 310, 314, 318 by an etching process without substantially affecting Si layers 308, 312, 316 of the nanosheet stack. In a particular embodiment, inner spacer shallow indentations 334a-334d are formed by a wet etching process such as a SC1@40C-400s process. In block 1616, fabrication system 107 forms a sacrificial inner spacer 336 on fins 320a, 320b by a conformal deposition process. In a particular embodiment, sacrificial inner spacer 336 is formed by a conformal In-situ Radical assisted deposition (iRAD) process. In block 1618, fabrication system 107 over-etches sacrificial inner spacer 330 to substantially remove the portions of sacrificial inner spacer 330 from inner spacer shallow indentations 334a-334d except for a portion of sacrificial inner spacer 330 deposited upon the SiGe layers of the nanosheet stack while leaving the portions of sacrificial inner spacer 330 upon the gate portions of fins 320a, 320b. In a particular embodiment, sacrificial inner spacer 330 is over-etched by a wet-etching process such as by using isotropic phosphoric acid (H3PO4) as an etching agent at a temperature of 165C.

In block 1620, fabrication system 107 forms NFET/PFET S/D region 338 within trench 332 between fins 320a, 320b by dual epitaxial growth of an eptixay material. In particular embodiments, the epitaxy material includes a. In block 1622, fabrication system 107 etches back sacrificial top spacer 330 and sacrificial inner spacer 360 to form inner spacer cavities 340 between NFET/PFET region 338 and SiGe layers 306, 310, 314, 318. In block 1624, fabrication system 107 expands inner spacer cavities 340 by an etching process. In a particular embodiment, inner spacer cavities 340 are expanded by an isotropic wet etching process such as a SC1-40C or using a hydrochloric acid(HCl)etching agent. In an alternative embodiment, inner spacer cavities 340 are expanded by a low-T oxidation process followed by an oxide etch.

In block 1626, fabrication system 107 etches back SiO2 gate liners 328a, 328b to substantially remove SiO2 gate liners 328a, 328b from fins 320a, 320b. In block 1628, fabrication system 107 forms a final low-K spacer 342 on fins 320a, 320b, and inner spacers 344 within inner spacer cavities 340. In a particular embodiment, low-K spacer 342 and inner spacers 344 are formed by a conformal deposition process such as by an iRad process. In a particular embodiment, low-K spacer 342 and inner spacers 344 are formed of a SiBCN material.

In block 1630, fabrication system 107 etches low-K spacer 342 to form final top spacer 346. In the embodiment, a final top spacer 346 is formed by etching low-K spacer 342. In a particular embodiment, final top spacer 346 is formed by an RIE process. In block 1632, fabrication system 107 forms gates of HKMG material 348a, 348b, SiN caps 350a and 350b and TS contact 352. As a result an nanosheet transistor is fabricated according. The fabrication system 107 ends process 1600 thereafter.

Thus, a computer implemented method is provided in the illustrative embodiments for fabricating nanosheet transistors in accordance with one or more illustrative embodiments and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a standalone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method of forming an integrated circuit, the method comprising:
   providing a nanosheet structure comprising:
      alternating sacrificial and channel layers in a stack;
      a gate structure over the stack;
      a pair of top sacrificial spacers disposed on opposite sides of the gate structure; and
      source/drain regions disposed on opposite sides of the stack, wherein the source/drain regions contact (i) opposite sides of each of the channel layers and (ii) sacrificial inner spacers disposed at an end of each of the sacrificial layers;
   removing the pair of top sacrificial spacers and the inner sacrificial spacers; and
   recessing (i) ends of the sacrificial layers and (ii) the source/drain regions from gaps left by removing the sacrificial inner spacers.

2. The method of claim 1, further comprising:
   subsequent to recessing (i) the ends of the sacrificial layers and (ii) the source/drain regions, forming replacement inner spacers.

3. The method of claim 2, wherein the replacement inner spacers comprise a low-k material.

4. The method of claim 2, wherein the replacement inner spacers comprise SiBCN.

5. The method of claim 2, wherein forming replacement inner spacers comprises depositing a dielectric material.

6. The method of claim 2, further comprising:
   subsequent to forming the replacement inner spacers, forming a final top spacer.

7. The method of claim 6, further comprising:
   subsequent to forming the final top spacer, replacing the gate structure and the sacrificial layers with a high-k metal gate.

8. The method of claim 6, wherein the replacement inner spacers and the final top spacer comprise the same material.

9. The method of claim 6, wherein forming a final top spacer comprises etching a material that was deposited to form the replacement inner spacers.

10. The method of claim 1, wherein a bottom layer of the alternating sacrificial and channel layers in a stack is a sacrificial layer comprising SiGe disposed on a dielectric isolation layer.

11. A method of forming an integrated circuit, the method comprising:
    providing a nanosheet structure comprising:
       alternating sacrificial and channel layers in a stack;

a gate structure over the stack;
a first and a second liner portion disposed on opposing sidewalls of the gate structure;
a first top sacrificial spacer disposed on an outer sidewall of the first liner portion and a second top sacrificial spacer disposed on an outer sidewall of the second liner portion; and
source/drain regions disposed on opposite sides of the stack, wherein the source/drain regions contact (i) opposite sides of each of the channel layers and (ii) sacrificial inner spacers disposed at an end of each of the sacrificial layers;
removing the first and second top sacrificial spacers and the inner sacrificial spacers; and
recessing (i) ends of the sacrificial layers and (ii) the source/drain regions from gaps left by removing the sacrificial inner spacers.

12. The method of claim 11, further comprising:
subsequent to recessing (i) the ends of the sacrificial layers and (ii) the source/drain regions, removing the first and second liner portions.

13. The method of claim 12, further comprising:
subsequent to removing the first and second liner portions, forming replacement inner spacers.

14. The method of claim 13, wherein the replacement inner spacers comprise a low-k material.

15. The method of claim 13, wherein the replacement inner spacers comprise SiBCN.

16. The method of claim 13, further comprising:
subsequent to forming the replacement inner spacers, forming a final top spacer.

17. The method of claim 16, wherein the replacement inner spacers and the final top spacer comprise the same material.

18. The method of claim 16, further comprising:
subsequent to forming the final top spacer, replacing the gate structure and the sacrificial layers with a high-k metal gate.

19. The method of claim 11, wherein a bottom layer of the alternating sacrificial and channel layers in a stack is a sacrificial layer comprising SiGe disposed on a dielectric isolation layer.

20. The method of claim 11, wherein a top layer of the alternating sacrificial and channel layers in a stack is a sacrificial layer comprising SiGe.

* * * * *